US012328106B2

(12) United States Patent
Huang et al.

(10) Patent No.: US 12,328,106 B2
(45) Date of Patent: Jun. 10, 2025

(54) POWER AMPLIFIER MODULATOR

(71) Applicant: Analog Devices International Unlimited Company, Limerick (IE)

(72) Inventors: Qingyi Huang, Shenzhen (CN); Yong Zhang, Beijing (CN); Mark Cope, Bath (GB); Bernhard Strzalkowski, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 622 days.

(21) Appl. No.: 17/738,842

(22) Filed: May 6, 2022

(65) Prior Publication Data

US 2023/0361731 A1 Nov. 9, 2023

(51) Int. Cl.
*H03F 1/30* (2006.01)
*H03F 1/02* (2006.01)
*H03F 3/24* (2006.01)
*H03F 3/72* (2006.01)

(52) U.S. Cl.
CPC ........... *H03F 3/245* (2013.01); *H03F 1/0227* (2013.01); *H03F 3/72* (2013.01); *H03F 2203/7206* (2013.01)

(58) Field of Classification Search
CPC ..................................... H03F 1/30; H03F 1/12
USPC ................................... 330/297, 296, 285, 51
See application file for complete search history.

(56) References Cited

U.S. PATENT DOCUMENTS

| 6,744,151 | B2 | 6/2004 | Jackson et al. |
| 7,808,313 | B2 | 10/2010 | Markowski et al. |
| 8,488,349 | B2 | 7/2013 | Hou |
| 9,496,828 | B2 | 11/2016 | Ye |
| 10,790,786 | B2 | 9/2020 | Henzler et al. |
| 10,903,796 | B2 | 1/2021 | Khlat et al. |

FOREIGN PATENT DOCUMENTS

CN 101872208 A 10/2010

OTHER PUBLICATIONS

Jin, Qian, et al., "Step-Wave Switched Capacitor Converter for Compact Design of Envelope Tracking Power Supply", IEEE Transactions on Industrial Electronics, 64(12), (2017), 4 pgs.
Wang, Chao, et al., "A Modular Cascaded Multilevel Buck Converter Based on GaN Devices Designed for High Power Envelope Elimination and Restoration Applications", IEEE Energy Conversion Congress and Exposition (ECCE), (2018), 4851-4857.

*Primary Examiner* — Henry Choe
(74) *Attorney, Agent, or Firm* — Schwegman Lundberg & Woessner, P.A.

(57) ABSTRACT

Various examples are directed to a circuit for biasing a power amplifier (PA). The circuit may comprise a first isolated power supply comprising a first DC output and a first common output as well as a second isolated power supply comprising a second DC output and a second common output. The second DC output may be electrically coupled to the first common output. The circuit may also comprise a switch network that is configurable to a first state in which the first DC output is provided at a circuit output and to a second state in which the second DC output is provided at the circuit output.

14 Claims, 8 Drawing Sheets

POWER AMPLIFIER MODULATOR

BACKGROUND

Communications over wire and wireless media, such as RF transmission, often use a power amplifier (PA) in a transmitter to produce a signal for transmission over the medium. The PA circuit may include a PA that receives a PA input signal. The PA amplifies the input signal generating a PA output signal that is transmitted over the medium.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
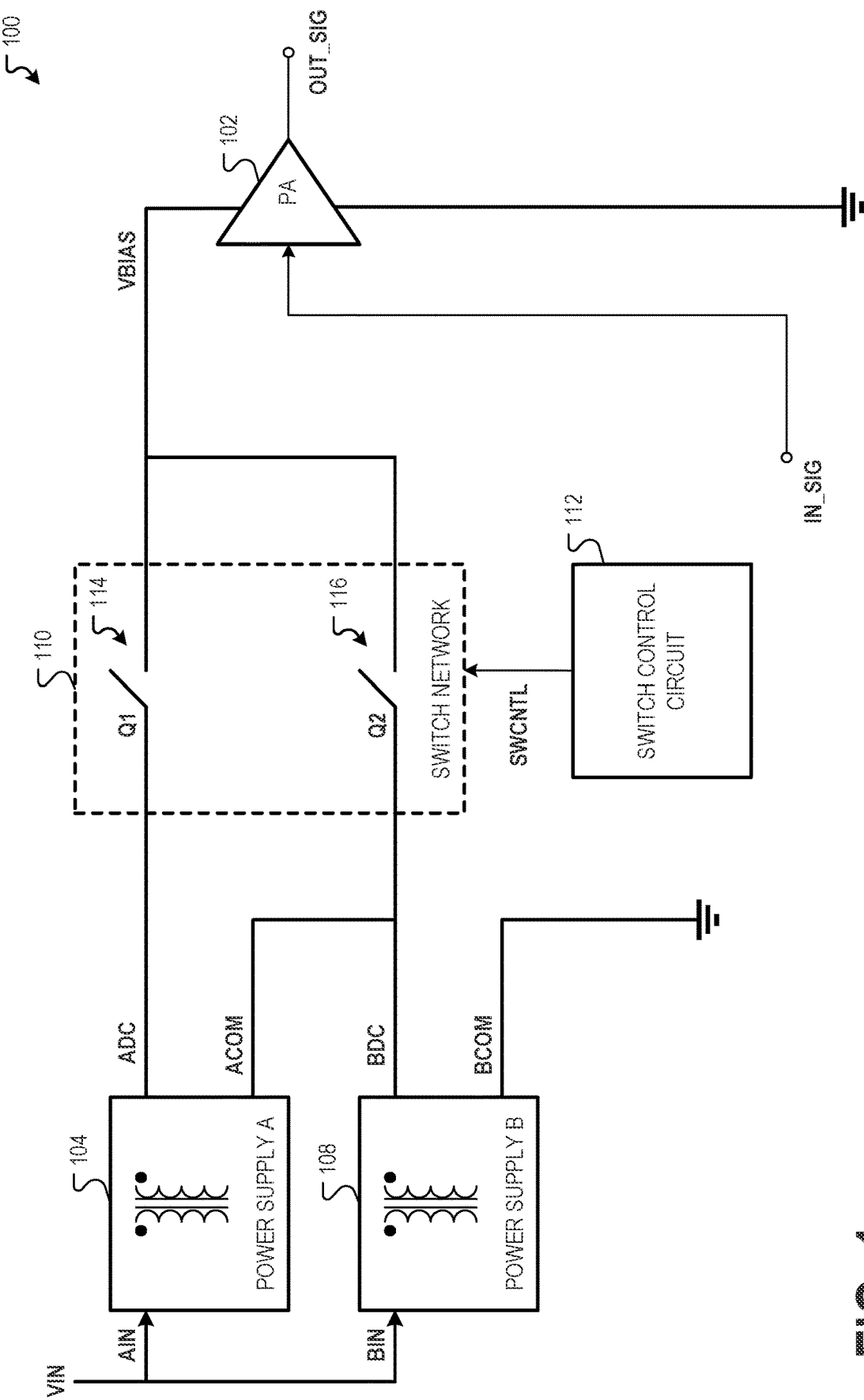
FIG. 1 is a diagram showing one example of a PA circuit comprising two power supplies.

In a PA circuit, a PA receives a PA input signal and generates a corresponding PA output signal. In some examples, the PA output signal is transmitted over a suitable wired or wireless medium. The PA is powered by a bias power supply arrangement that provides a bias power to the PA. In some examples, the voltage and/or current of the bias power may be selected to maintain the PA in a near linear mode of operation, thus maintaining a linear or near linear relationship between the PA input signal and the PA output signal. In other examples, the bias power is set to avoid saturation but the PA is distinctly nonlinear and additional linearity correction, e.g. digital predistortion, is used to linearize the PA. If the bias power is too low relative to the PA input signal, then the PA may operate in saturation, generating a PA output signal that is clipped or otherwise distorted. In arrangements where information is encoded on the amplitude of the PA input signal, clipping or distortion can lead to the loss of encoded information and undesired spectral emissions. On the other hand, if the bias power is too high relative to the PA input signal, the PA may expend more energy than is necessary to generate the desired PA output signal.

In some examples, a PA is biased with a constant bias power (e.g., a bias power having a constant voltage or a constant current). The constant bias power may be selected to maintain the PA in the linear mode of operation over a range of expected PA input signal values. For example, the bias power may be selected such that the PA does not saturate or clip in response to a highest-expected value of the PA input signal. In arrangements with a constant bias power, the overall efficiency of the PA may depend on the value of the PA input signal. For example, when the PA input signal value is at a high end of its expected range, the full value of the constant bias power may be utilized to prevent the PA from distorting. On the other hand, however, when the PA input signal is not at the high end of its expected range, the constant bias power may be higher than what is needed to prevent undesired PA output signal clipping or other distortion. The difference between the constant bias power and the bias power needed to prevent signal clipping for a given PA input signal value may constitute wasted energy.

To improve efficiency, some PA circuits utilize envelope tracking techniques. According to envelope tracking, the bias power is modified based on the value of the PA input signal. A multi-level and/or variable bias power supply is used to generate different bias power levels (e.g., different voltages or currents). A control circuit controls the bias power supply to provide an appropriate bias power based on the value of the PA input signal. For example, when the PA input signal is relatively high, the control circuit may drive the bias power high so as to prevent clipping or other distortion at the PA output signal. When the PA input signal is relatively low, the control circuit may drive the bias power lower. This may reduce the difference between the actual bias power at a given time and the bias power needed to prevent clipping for a given PA input signal level at that time.

Some examples utilize symbol-based envelope tracking. Symbol-based envelope tracking may be useful, for example, when the amplitude of the PA input signal consists of a sequential series of symbols. A symbol may be constant information that is transmitted over a time period, which may be referred to as a symbol period. According to symbol-based envelope tracking, the bias power is selected during a symbol period to be just high enough to transmit a specific symbol power, which may be related to the information contained in the symbol. For example, a symbol having a higher symbol power may use a higher bias power, such as a higher drain voltage for a field effect transistor (FET) based amplifier or a higher collector voltage for a bipolar junction transistor (BJT). On the other hand, a symbol having a lower symbol power may use a lower bias power, such as a lower drain voltage in a FET based amplifier or a lower collector voltage in a BJT based amplifier.

In some examples, a technique such as orthogonal frequency division multiplexing (OFDM) is used to encode information onto the PA input signal for transmission. For example, OFDM may be used to transmit Long-Term Evolution (LTE) or 5G signals. According to OFDM, a large number of sine waves are additively combined. During a symbol period, the information encoded on the PA input signal (e.g., the additive combination of sine waves) may be constant. In some examples, the root mean square (RMS) power of the PA input signal may be constant during a symbol period. Consider an example in which the PA input signal is encoded with a series of symbols, according to OFDM or another suitable encoding scheme. During a first symbol period, the PA input signal may have a first voltage range corresponding to a first symbol. During a second symbol period, the PA input signal may have a second voltage range corresponding to a second symbol, and so on.

The control circuit may be configured to select the bias power for the PA based on the symbol power of the symbol that is being provided to the PA by the PA input signal. In this example, the symbol power may be based on the voltage range of the PA input signal during the respective symbol periods.

Some envelope tracking techniques, including many symbol-based envelope tracking techniques, utilize a biasing power supply that generates a discrete number of different bias power amplitudes. In some examples the biasing power supply includes a series combination of an isolated power supply and a DC-DC converter. The power supply provides an output at one amplitude level (e.g., one voltage level). The DC-DC converter receives the output of the power supply and generates multiple converter outputs, with each converter output having a different amplitude level (e.g., a different voltage level or a different current level). The DC-DC converter may be of any suitable design such as, for example, a step-down converter, a switched capacitor converter, and/or the like. The control circuit selects one of the converter outputs generated by the DC-DC converter and provides the selected converter output to the PA as the bias power.

Arrangements including a series combination of a power supply and a DC-DC converter, however, can suffer from disadvantages related to efficiency. For example, the total efficiency of the series combination of the isolated power supply and the DC-DC converter is equal to the product of the efficiencies of the individual components. For example, if the efficiency of the power supply is X % and the efficiency of the DC-DC converter is Y %, then the overall efficiency of the series combination of the power supply and the DC-DC converter would be equal to X % Y %. Because X and Y are less than 100%, this means that the efficiency of the series combination of the power supply and the DC-DC converter is less than the individual efficiency of either component.

Various examples address these and other challenges by utilizing a stacked arrangement of multiple isolated power supplies to generate bias power for a PA at multiple amplitude levels (e.g., multiple current levels and/or multiple voltage levels). Each of the isolated power supplies has an input, a direct current (DC) output, and a common output. The isolated power supplies may receive an input voltage and generate an output voltage between their respective DC outputs and common outputs. Consider an example that includes a stacked arrangement of two isolated power supplies. The common output of a first isolated power supply may be electrically coupled to the DC output of a second isolated power supply. The common output of the second isolated power supply may be electrically coupled to ground. In this way a ground-referenced voltage at the DC output of the first isolated power supply may be equal to the sum of the first isolated power supply output voltage and the second isolated power supply output voltage. A ground-referenced voltage at the DC output of the second isolated power supply may be equal to the second isolated power supply output voltage. A switch network may be positioned to alternatively connect the DC output of the first isolated power supply or the DC output of the second isolated power supply as the bias power to a PA.

Because the first and second isolated power supplies are in a stacked arrangement, the PA circuit may not suffer the efficiency penalties that are present in a series combination of a power supply and a DC-DC converter. Consider an example in which the first isolated power supply and the second isolated power supply both have an efficiency of X %. In this case the efficiency of the combination of the first and second isolated power supplies would be X %.

In various examples a biasing power supply arrangement may provide more than two bias power levels, for example, by including more than two isolated power supplies stacked as described herein. For an example an arrangement with three stacked isolated power supplies may provide three unique bias power levels. An arrangement with N stacked isolated power supplies may provide N unique bias power voltage levels.

FIG. 1 is a diagram showing one example of a PA circuit 100. The PA circuit 100 includes a PA 102 that is biased by a bias power, described in this example by a bias power-voltage VBIAS. The bias power-voltage VBIAS is generated by a power supply 104 and a power supply 108. In the example arrangement of FIG. 1, the bias power-voltage VBIAS is described as a voltage, although in other examples, the power supplies 108, 104 may generate a bias power that varies by current as well. The PA 102 also receives a PA input signal IN_SIG and generates a PA output signal OUT_SIG. The bias power-voltage VBIAS is provided to the PA 102 at an appropriate location based on the design of the PA 102. For example, in arrangements where the PA 102 includes a single FET, the bias power-voltage VBIAS may be provided at a drain of the FET. In an arrangement where the PA 102 includes a single BJT, the bias power-voltage VBIAS may be provided at the collector of the BJT. Other PA configurations may receive the bias power-voltage VBIAS at other locations. The PA 102 may be or include any suitable PA arranged according to any suitable topology.

The power supply 104 may be an isolated power supply. For example, the outputs of the power supply, a DC output ADC, and a common output ACOM, may be electrically isolated from an input AIN to the power supply 104. Isolation may be provided by any suitable mechanism. In the example of FIG. 1, the power supply 104 includes a transformer to provide isolation between the input AIN and the outputs ADC and ACOM. In some examples, isolation may be provided by other mechanisms including, for example, the use of optical isolators. The power supply 108 may also have an input BIN, a DC output BDC, and a common output BCOM. The power supply 108 may also be an isolated power supply with the input BIN electrically isolated from the outputs BDC and BCOM in a manner similar to that of the power supply 104.

In the example of FIG. 1, the power supplies 104, 108 generate a DC voltage. For example, the power supplies 104, 108 may have respective output voltages. The output voltages of the power supplies 104, 108 indicate a voltage difference between the respective DC outputs and (ADC, BDC) and common outputs (ACOM, BCOM) when the power supplies 104, 108 are receiving an input voltage VIN at their respective inputs (AIN, BIN). For example, when the power supply 104 receives the voltage VIN at its input AIN, it may drive its outputs ADC, ACOM such that the voltage at the DC output ADC is higher than the voltage at the common output ACOM by an amount equal to the output voltage of the power supply 104. Similarly, when the power supply 108 receives the voltage VIN at its input BIN, it may drive its outputs BDC, BCOM such that the voltage at the DC output BDC is higher than the voltage at the common output BCOM by an amount equal to the output voltage of the power supply 108.

The power supplies 104, 108 may have the same output voltages or different output voltages. The power supplies 104, 108 may also have the same power ratings or different power ratings. In the example of FIG. 1, the stacked power supplies 104, 108 may be capable of providing a power level to the PA 102 that is equal to the sum of the power ratings of the power supplies 104, 108. Because of this, the power supplies 104, 108 may have lower power levels than what would be used in a single power supply arrangement, such as in a series combination of an isolated power supply and a DC-DC converter. Consider an example in which the PA circuit 100 is rated to 1000 W. The power supplies 104, 108, in some examples, may be rated to 500 W. The use of multiple, lower-power supplies may lead to cost savings relative to arrangements using a single, higher-power supply. For example, the component costs per Watt for producing a lower power supply may be less than those for producing higher power supplies.

The power supplies 104, 108 may be electrically coupled in a stacked arrangement, as shown in FIG. 1. For example, the common output ACOM of the power supply 104 may be electrically coupled to the DC output BDC of the power supply 108 as shown. The common output BCOM of the power supply 108 may be electrically coupled to ground as shown. In this configuration, the ground-referenced voltage at the DC output ADC of the power supply 104 is equal to the sum of the output voltage of the power supply 104 and the output voltage of the power supply 108. The ground-referenced voltage at the DC output BDC of the power supply 108 is equal to the output voltage of the power supply 108. Also, the maximum power available at the DC output ADC of the power supply 104 may be the sum of the power of the first power supply 104 and the second power supply 108. The power available at the DC output BDC of the power supply 108 may be the power of the second power supply 108. In some examples, PA 102 may draw less than half of its peak power when the bias power-voltage VBIAS is at half of its maximum voltage. Accordingly, the second power supply 108 may be selected with a maximum power that is about equal to that of the maximum power of first power supply 104.

A switch network 110 selectively couples either the DC output ADC of the power supply 104 or the DC output BDC of the power supply 108 as the bias power VBIAS provided to the PA 102. The switch network 110 comprises a switch 114 and a switch 116. The switches 114, 116 may be any suitable type of switches such as, for example, field effect transistors (FETs), bipolar junction transistors, mechanical relays, and/or the like.

In this example the switch network 110 may assume a first state and a second state. In the first state, the switch 114 is a closed circuit and the switch 116 is an open circuit. In the first state, the DC output ADC of the power supply 104 is provided to the PA 102 as the bias power-voltage VBIAS. Because the voltage at the DC output ADC of the power supply 104 is the sum of the output voltages of the power supplies 104 and 108, when the switch network 110 is in the first state, the bias power-voltage VBIAS also has a voltage equal to the sum of the output voltages of the power supplies 104 and 108. In the second state, the switch 114 is an open circuit and the switch 116 is a closed circuit. In the second state, the DC output BDC of the power supply 108 is provided to the PA 102 as the bias powervoltage VBIAS. Because the voltage at the DC output BDC of the power supply 108 is the output voltage of the power supply 108, when the switch network 110 is in the second state, the bias powervoltage VBIAS also has a voltage equal to the output voltage of the power supply 108.

In examples in which the bias power is provided and/or described as a current, the state of the switch network 110 may be considered to determine the current provided to the PA 102. For example, when the switch network 110 is in the first state (e.g., switch 114 closed and switch 116 open), the bias power-current provided to the PA 102 may be equal to the current provided by the power supply 104. When the switch is in the second state (e.g., switch 114 closed and switch 116 closed), the bias power-current provided to the PA 102 may be equal to the sum of the current provided by the power supply 104 and the current provided by the power supply 108.

A switch control circuit 112 determines a state for the switch network 110 based on the symbol power of the symbol to be transmitted by the PA 102. The switch control circuit 112 generates a switch signal control signal SW_CNTL that is provided to the switch network 110 to configure the switches 114, 116. An example switch control circuit 612 described in FIG. 6 below provides additional details of the operation of switch control circuits, such as the switch control circuit 112. receives the PA input signal IN_SIG.

Figure 2:
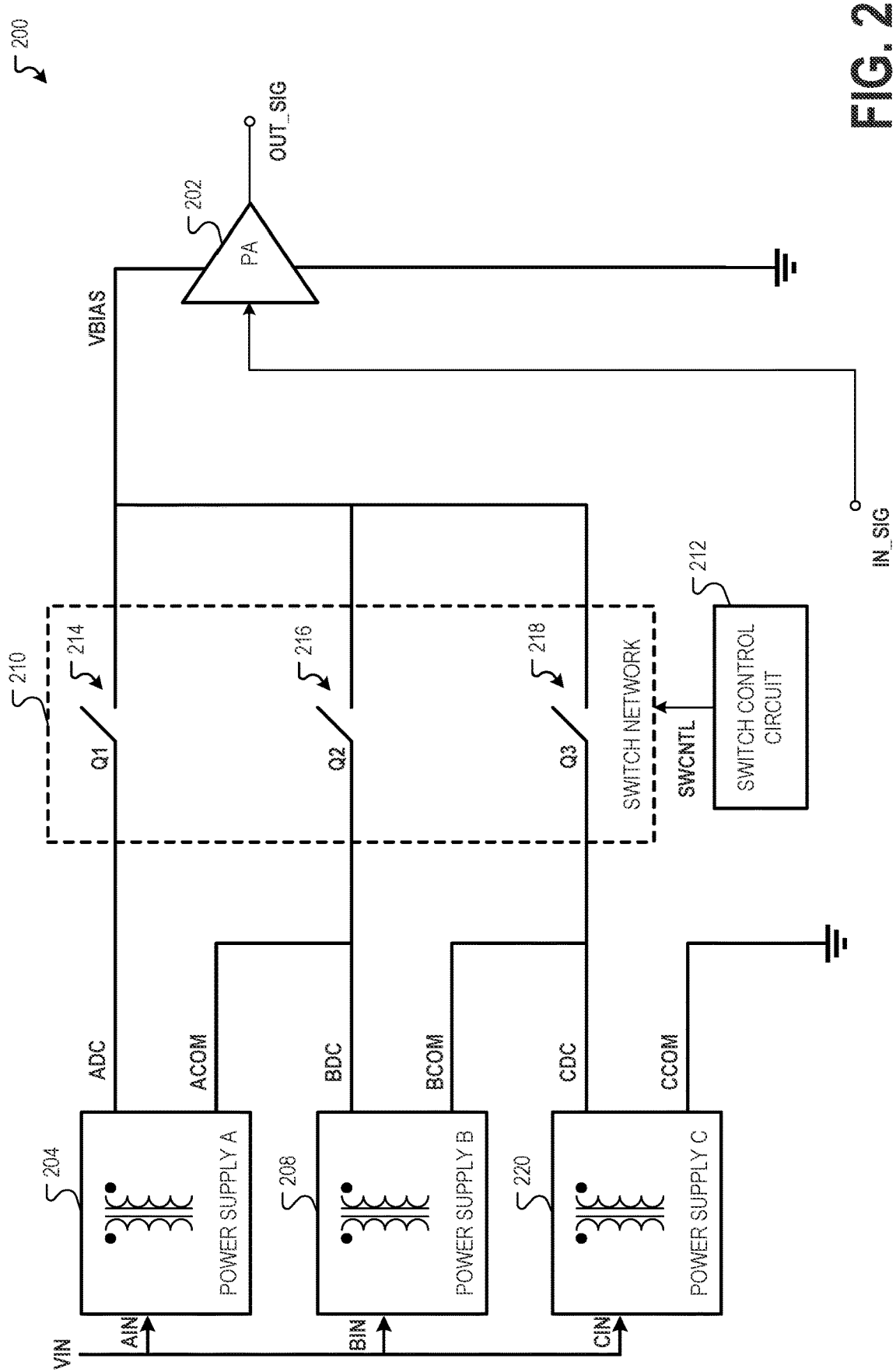
FIG. 2 is a diagram showing another example of a PA circuit comprising three power supplies.

FIG. 2 is a diagram showing another example of a PA circuit 200. The PA circuit 200 includes a PA 202, which may be similar to the PA 102 of FIG. 1. For example, the PA 202 receives a bias power-voltage VBIAS. The PA 202 may also receive a PA input signal IN_SIG and generate a PA output signal OUT_SIG. The PA circuit 200 also includes three power supplies 204, 208, 220 and may provide one of three voltage levels of the bias power-voltage VBIAS, allowing three-level power modulation to be provided to the PA 202. The power supplies 204, 208, 220 may be isolated power supplies, similar to the power supplies 104, 108 of FIG. 1.

The power supplies 204, 208, 220 are arranged in a stacked configuration similar to that shown in FIG. 1. A DC output ADC of the power supply 204 is provided to the switch network 210. A common output ACOM of the power supply 204 is electrically coupled to a DC output BDC of the power supply 208 and also provided to the switch network 210. A common output BCOM of the power supply 208 is electrically coupled to an output voltage CDC of the power supply 220 and also provided to the switch network 210. A common output CCOM of the power supply 220 is electrically coupled to ground.

In the arrangement of FIG. 2, the ground-referenced voltage at the DC output ADC of the power supply 204 maybe equal to a sum of the output voltages of the power supplies 204, 208, and 220. The power available at the DC output ADC of the power supply 204 may be the sum of the power of the power supplies 204, 208, 220. The ground-referenced voltage at the DC output BDC of the power supply 208 maybe equal to a sum of the output voltages of the power supply 208 and of the power supply 220. The power available at the DC output BDC of the power supply 208 may be equal to the sum of the power of the power supplies 208 and 220. The ground-referenced voltage at the DC output CDC of the power supply 220 may be equal to the output voltage of the power supply 220. The power available at the DC output CDC of the power supply 220 may be the power of the power supply 220.

The switch network 210 comprises switches 214, 216, and 218, which may be similar to the switches 114, 116 of FIG. 1. The switch network 210 may assume a first state in which the switch 214 is a closed circuit and the switches 216, 218 are open circuits. In the first state, the bias power-voltage VBIAS provided to the PA 202 is the sum of the output voltages of the power supplies 204, 208, and 220 and the power available is the sum of the power of the power supplies 204, 208, 220. In a second state the switch 214 is an open circuit, the switch 216 is a closed circuit, and the switch 218 is an open circuit. In the second state, the bias power-voltage VBIAS provided to the PA is the sum of the output voltages of the power supplies 208 and 220, and the power available to the PA 202 is the sum of the power of the power supplies 208, 220. The switch network 210 may also assume a third state in which the switches 214, 216 are open circuits and the switch 218 is a closed circuit. In the third state the bias power-voltage VBIAS provided to the PA 202 is the output voltage of the power supply 220 and the power available to the PA 202 is the power of the power supply 220.

Figure 6:
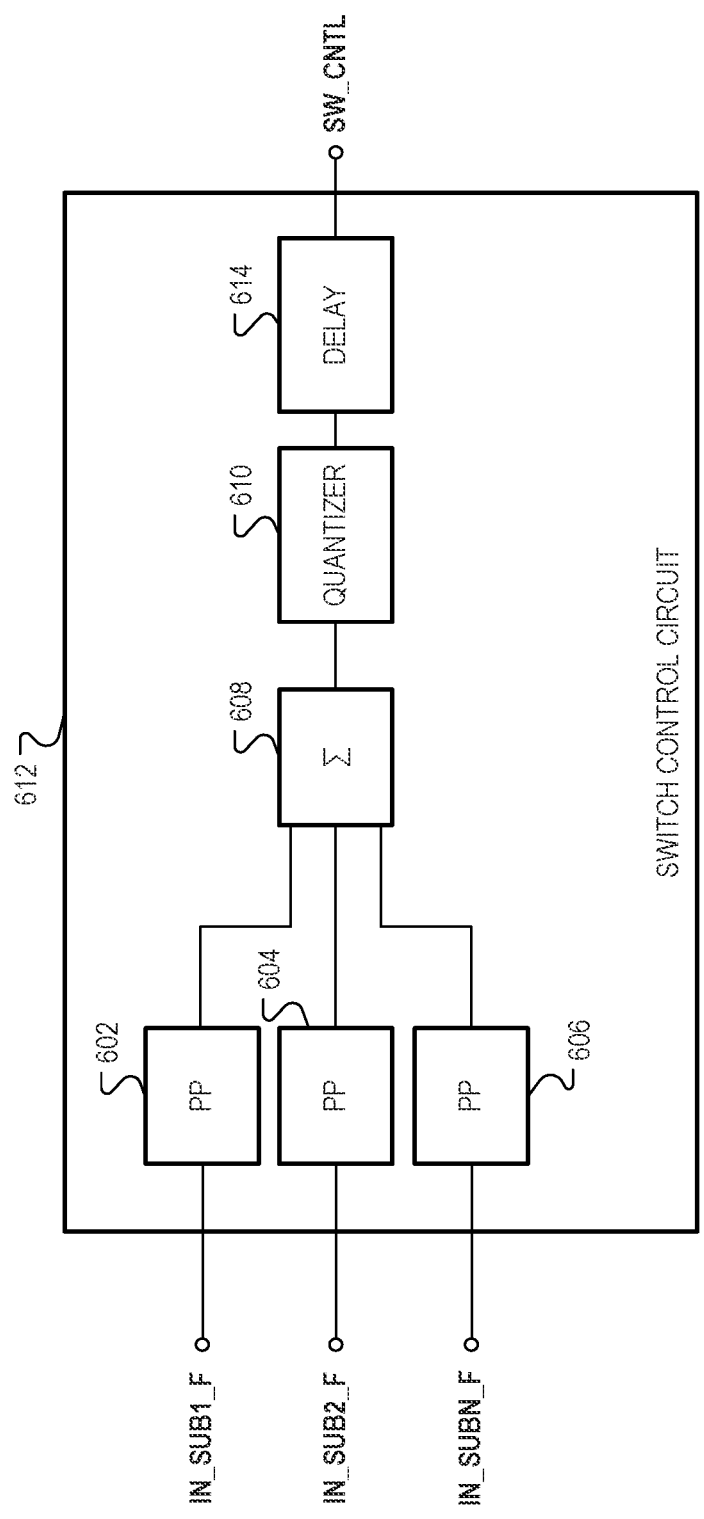
FIG. 6 is a diagram showing one example arrangement of a switch control circuit.

The switch network 210 may be controlled by a switch control circuit 212, which may generate a switch control signal SW_CNTL in a manner similar to that used by the switch control circuit 112 shown and described with respect to FIG. 1 and/or the example provided herein at FIG. 6.

Figure 3:
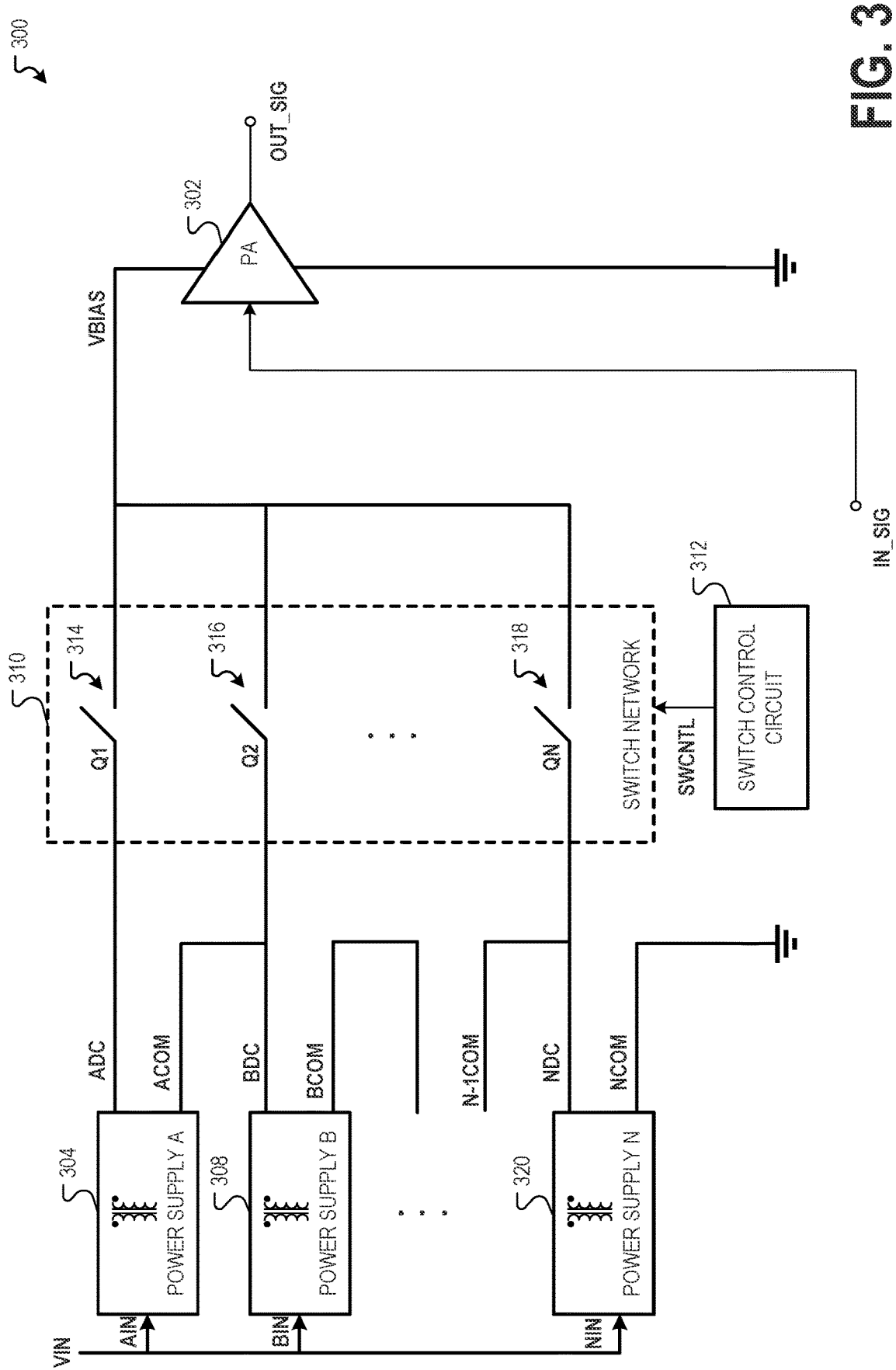
FIG. 3 is a diagram showing yet another example of a PA circuit comprising N power supplies.

FIG. 3 is a diagram showing yet another example of a PA circuit 300. The PA circuit 300 includes a PA 302, which may be similar to the PA 102 of FIG. 1 and the PA 202 of FIG. 2. For example, the PA 302 may also receive a PA input signal IN_SIG and generate a PA output signal OUT_SIG. The PA circuit 300 includes N power supplies 304, 308, 320 and may provide one of N voltage levels at the bias power-voltage VBIAS. The N power supplies 304, 308, 320 may be isolated power supplies similar to the power supplies 104, 108 of FIG. 1 and to power supplies 204, 208 of FIG. 2.

The N power supplies 304, 308, 320 of FIG. 3 may also be arranged in a stacked configuration A DC output ADC of the power supply 304 is provided to a switch network 310. A common output ACOM of the power supply 304 is electrically coupled to a DC output BDC of the power supply 308 and also provided to the switch network 310. A common output BCOM of the power supply 308 is electrically coupled to an output voltage of a next power supply. Additional power supplies (not shown) may be electrically coupled in a stacked configuration. A common output of an N−1 power supply is electrically coupled to the DC output NDC of the power supply 320, which is also electrically coupled to the switch network 310. A common output NCOM of the power supply 320 is electrically coupled to ground.

In the arrangement shown in FIG. 3, the ground-referenced voltage of the N power supplies may be equal to the sum of the output voltages of power supplies between that power supply and ground. For example, the ground-referenced voltage at the DC output ADC of the power supply 304 maybe equal to a sum of the output voltages of all N power supplies 304, 308, 320. Likewise, the power available at the DC output ADC of the power supply 304 may be the sum of the power of all N power supplies 304, 308, 320. The ground-referenced voltage at the DC output BDC of the power supply 308 maybe equal to a sum of the output voltages of all N power supplies, minus the output voltage of the power supply 304 and so on. The power available at the DC output BDC of the power supply 308 may be the sum of the power of all N power supplies minus the power of the power supply 304, and so on. The ground-referenced voltage at the DC output NDC of the power supply 320 may be the output voltage of the power supply 320. The power available at the DC output BDC of the power supply 320 may be the power of the power supply 320.

The switch network 310 comprises N switches including switches 314, 316, 318, similar to the switches 114, 116 of FIG. 1 and the switches 214, 216, 218 of FIG. 2. The switch network 310 may assume N states where, in each of the N states, the DC output of one of the N power supplies 304, 308, 320 is provided as the bias power-voltage VBIAS. For example, the switch network 310 may assume a first state in which the switch 314 is a closed circuit and the other N−1 switches are open circuits. In the first state the bias power-voltage VBIAS provided to the PA 302 is the sum of the output voltages of all N power supplies 304, 308, and 320. In a second state the switch 314 is an open circuit, and the other N−1 switches are open circuits. In the second state, the bias power-voltage VBIAS provided to the PA is the sum of the output voltage of the power supply 308 and the output voltages of the power supplies 320 closer to ground than the power supply 308. Additional states may be obtained by closing additional switches (not shown) to provide the DC outputs of additional power supplies to the bias power-voltage VBIAS. In an Nth state, the switch 318 is a closed circuit and the other N−1 switches are open circuits. In the Nth state, the bias power-voltage VBIAS provided to the PA 302 is the output voltage of the power supply 320. The switch network 310 may be controlled by a switch control circuit 312 that is similar to the switch control circuit 112, which may generate a switch control signal SW_CNTL in a manner similar to that used by the switch control circuit 112 shown and described with respect to FIG. 1 and/or the example provided herein at FIG. 6.

Figure 4:
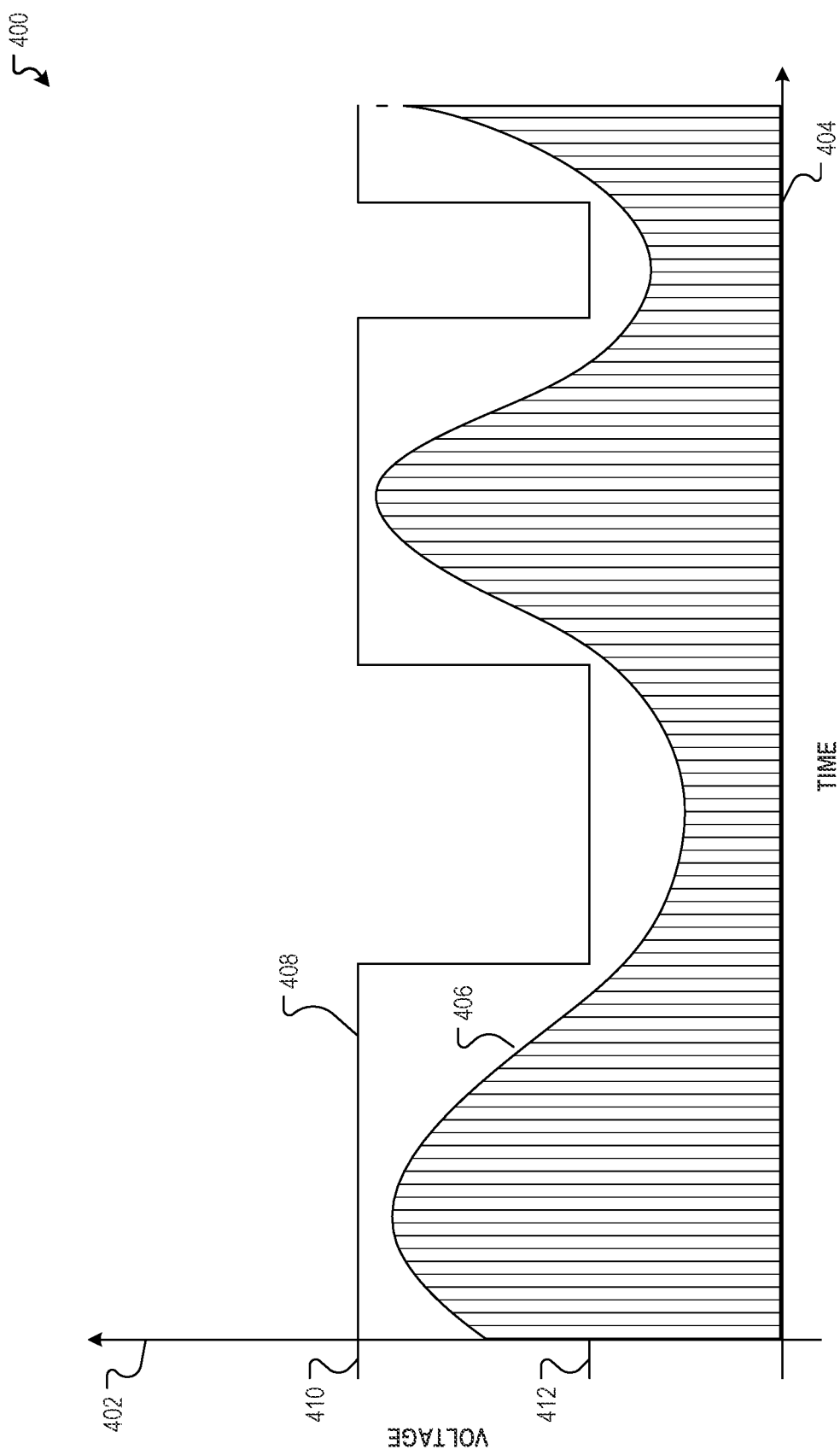
FIG. 4 is a chart illustrating an example of envelope tracking performed with the PA circuit of FIG. 1.

FIG. 4 is a chart 400 illustrating an example of envelope tracking performed with the PA circuit 100 of FIG. 1. The chart 400 comprises a horizontal axis 404 representing time and a vertical axis 402 representing voltage. A PA input signal 406 and a bias power 408 are plotted on the chart 400. The bias power 408 has two voltage levels, a voltage level 410 equal to the sum of the output voltages of the power supply 104 and the power supply 108, and a voltage level 412 equal to the output voltage of the power supply 108. As shown, when the PA input signal 406 is higher, the switch control circuit 112 configures the switch network 110 to drive the bias power to the higher voltage level 410. When the PA input signal 406 is lower, the switch control circuit 112 configures the switch network 110 to drive the bias power to the lower voltage level 412. This may reduce energy consumption at the PA circuit 100 relative to an arrangement having a fixed bias power at the higher voltage level 410.

Figure 5:
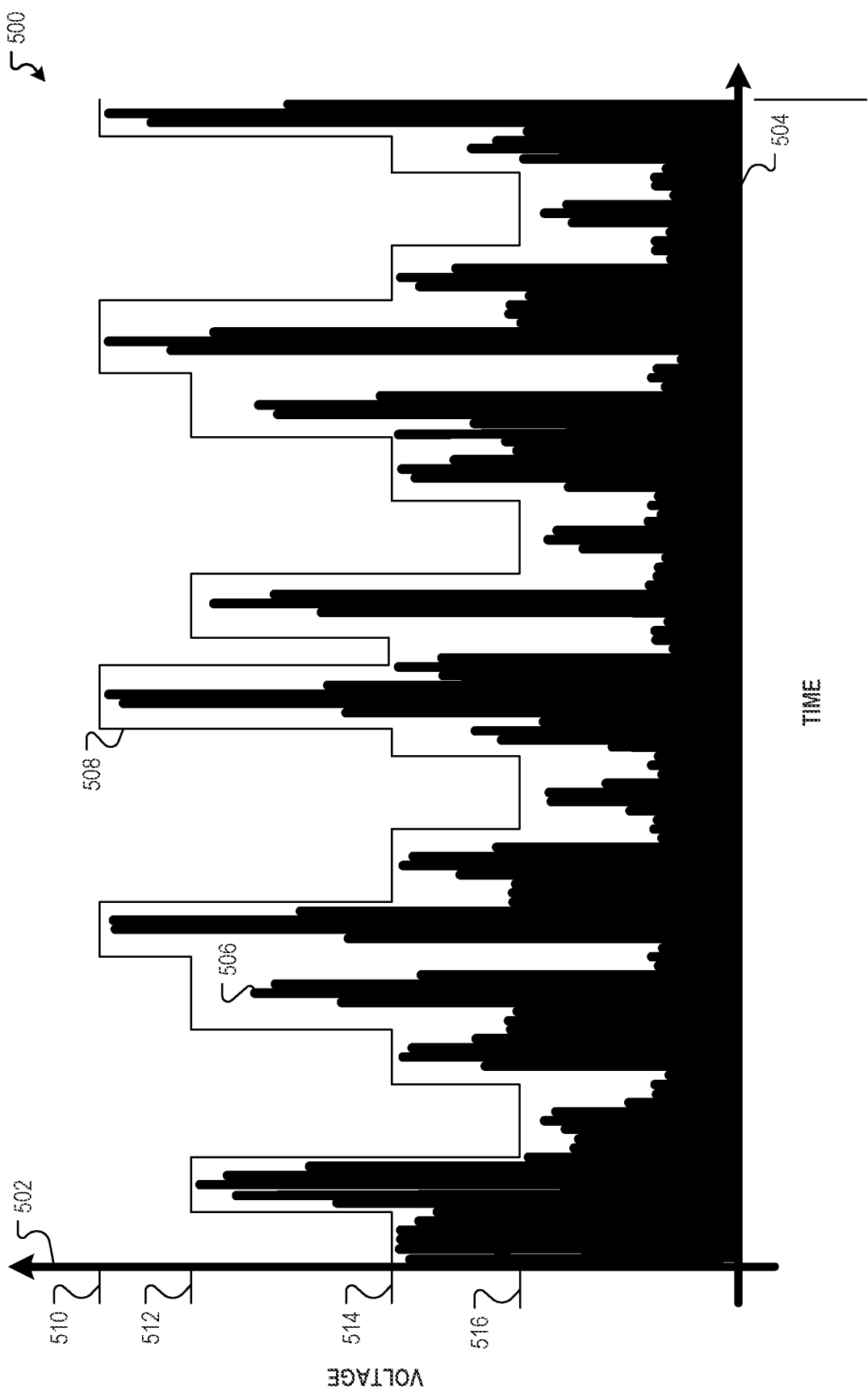
FIG. 5 is a chart illustrating an example of envelope tracking performed with the PA circuit of FIG. 3.

FIG. 5 is a chart 500 illustrating an example of envelope tracking performed with the PA circuit 300 of FIG. 3. The chart 500 comprises a horizontal axis 504 representing time and a vertical axis 502 representing voltage. A PA input signal 506 and a bias power 508 are plotted on the chart 500. The bias power 508, in this example, has four voltage levels, a voltage level 510, a voltage level 512, a voltage level 514, and a voltage level 516. To generate the four voltage levels 510, 512, 514, 516, four power supplies may be used, for example, in an arrangement similar to that shown in FIG. 3 where N is equal to four. The switch control circuit 312 may be configured to configure the switch network 310 such that the bias power 508 is at one of the four voltage levels 510, 512, 514, 516 depending on the symbol power of the symbol to be transmitted by the PA at a given symbol period.

The chart 500, in some examples, may represent symbol-based envelope tracking. For example, the switch control circuit 312 may select a voltage level 510, 512, 514, 516 for the bias power 508 for each symbol period. During each symbol period, the statistics of the waveform of PA input signal 506, such as the RMS power and/or voltage, may be constant, although, as shown, peak power and/or voltage may vary within a symbol period.

FIG. 6 is a diagram showing one example arrangement of a switch control circuit 612. The switch control circuit 612 is one example way that the switch control circuits 112, 212, 312 may be implemented. The switch control circuit 612 receives the PA input signal and/or another signal or signals indicating the PA input signal. In this example, the switch control circuit 612 receives multiple carrier frequency domain signals IN_SUB1_F, IN_SUB2_F, and IN_SUBN_F. Each carrier frequency domain signal indicates the frequency content of various carriers that are summed to generate the composite PA input signal. Although three carrier frequency domain signals IN_SUB1_F, IN_SUB2_F, and IN_SUBN_F are shown in FIG. 6, it will be appreciated that more or fewer carrier frequency domain signals may be used.

The switch control circuit 612 utilizes preprocessing components 602, 604, 606 to perform various pre-processing on the respective subcarrier frequency domain signals IN_SUB1_F, IN_SUB2_F, and IN_SUBN_F. Preprocessing performed by the various preprocessing components 602, 604, 606 may include, for example, summing the power of the various waveforms making up the subcarrier frequency domain signals IN_SUB1_F, IN_SUB2_F, and IN_SUBN_F, compensating for the gain that other circuit components, such as digital upconverters (DUCs) will add to the PA input signal, and the like. A summation component 608 may sum the power of all of the various waveforms of the subcarrier frequency domain signals IN_SUB1_F, IN_SUB2_F, and IN_SUBN_F, resulting in a total power of the constituent waveforms of the subcarrier frequency domain signals IN_SUB1_F, IN_SUB2_F, and IN_SUBN_F.

A quantizer component 610 utilizes the total power to generate a switch control signal SW_CNTRL. The switch control signal SW_CNTRL may be provided to configure a switch network, such as the switch network 110, the switch network 210, the switch network 310, and the like. An optional delay component 614 may apply a delay to the switch control signal SW_CNTRL before it is applied to the switch network 110, 210, 310. The delay may be selected to compensate for propagation delays that may be applied to the PA input signal before it is provided to the PA such as, for example, by components such as a DUC, digital predistortion (DPD), Crest Factor Reduction (CFR), and the like.

Figure 7:
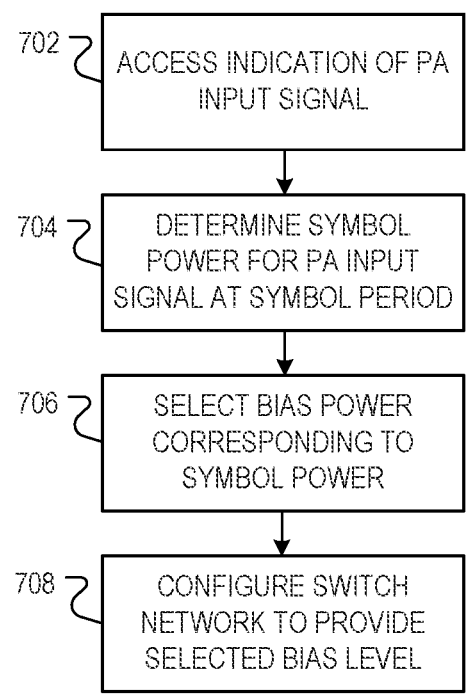
FIG. 7 is a flow chart showing one example of a process flow that may be executed by a switch control circuit to implement symbol-based envelope tracking using a PA circuit.

FIG. 7 is a flow chart showing one example of a process flow 700 that may be executed by a switch control circuit such as the switch control circuit 112 of FIG. 1, the switch control circuit 212 of FIG. 2, the switch control circuit 312 of FIG. 3 and/or the switch control circuit 612 of FIG. 6. At operation 702, the switch control circuit may access an indication of a PA input signal. For example, the switch control circuit may receive the PA input signal. In some examples, the indication of the PA input signal may include one or more carrier frequency domain signals such as the carrier frequency domain signals IN_SUB1_F, IN_SUB2_F, and IN_SUBN_F of FIG. 6.

At operation 704, the switch control circuit may determine a symbol power for a considered symbol period of the PA input signal. For example, the switch control circuit may sum the power of the various waveforms (e.g., sine waves) making up the PA input signal. At operation 706, the switch control circuit select a bias power level corresponding to the symbol power determined at operation 704. The bias power level may be selected such that the PA will generate an undistorted PA output signal for the given PA input signal. At operation 708 the switch control circuit configures the switch network to provide the selected bias level as the bias power to the PA, for example, by providing the switch control signal SW_CNTL to the switch network.

The switch control circuit, in some examples, is configured to repeatedly execute the process flow 700, for example, while the PA circuit is operative. The frequency with which the switch control circuit executes the process flow 700, in some examples, is determined based on the frequency at which symbols are encoded onto the amplitude of the PA input signal. The switch control circuit may execute the process flow 700 once for each symbol period. For example, if symbols are encoded onto the amplitude of the PA input signal at a rate of 20 kHz (e.g., 20000 symbols per second), then the switch control circuit may execute the process flow 700 every 50 microseconds.

Figure 8:
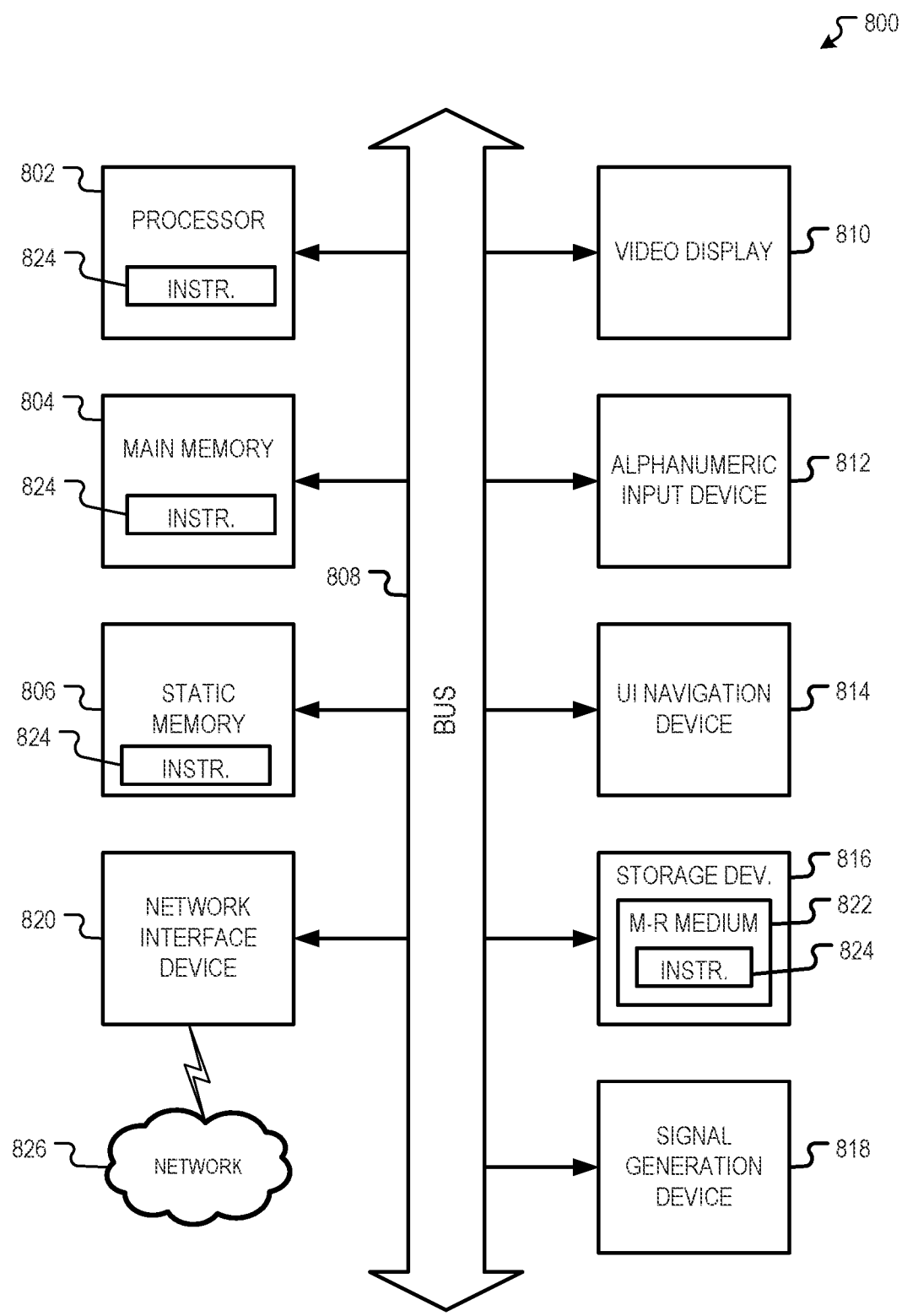
FIG. 8 is a block diagram illustrating a computing device hardware architecture, within which a set or sequence of instructions can be executed to cause a machine to perform examples of any one of the methodologies discussed herein.

FIG. 8 is a block diagram illustrating a computing device hardware architecture 800, within which a set or sequence of instructions can be executed to cause a machine to perform examples of any one of the methodologies discussed herein. For example, the architecture 800 may describe one or more digital signal processors (DSPs), application specific integrated circuits (ASICs), field programmable gate arrays (FPGAs), or similar hardware that may be used, in some examples, to implement any of the circuits described herein. For example, the various switch control circuits 112, 212, 312 may be implemented using all or portions of a hardware architecture such as the architecture 800.

The architecture 800 may operate as a standalone device or may be connected (e.g., networked) to other machines. In a networked deployment, the architecture 800 may operate in the capacity of either a server or a client machine in server-client network environments, or it may act as a peer machine in peer-to-peer (or distributed) network environments. The architecture 800 can be implemented in an embedded system, a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 800 includes a processor unit 802 comprising at least one processor (e.g., a central processing unit (CPU), a graphics processing unit (GPU), or both, processor cores, compute nodes). The architecture 800 may further comprise a main memory 804 and a static memory 806, which communicate with each other via a link 808 (e.g., a bus). The architecture 800 can further include a video display unit 810, an input device 812 (e.g., a keyboard), and a UI navigation device 814 (e.g., a mouse). In some examples, the video display unit 810, input device 812, and UI navigation device 814 are incorporated into a touch-screen display. The architecture 800 may additionally include a storage device 816 (e.g., a drive unit), a signal generation device 818 (e.g., a speaker), a network interface device 820, and one or more sensors (not shown), such as a Global Positioning System (GPS) sensor, compass, accelerometer, or other sensor.

In some examples, the processor unit 802 or another suitable hardware component may support a hardware interrupt. In response to a hardware interrupt, the processor unit 802 may pause its processing and execute an Interrupt Service Routine, for example, as described herein.

The storage device 816 includes a machine-readable medium 822 on which is stored one or more sets of data structures and instructions 824 (e.g., software) embodying or used by any one or more of the methodologies or functions described herein. The instructions 824 can also reside, completely or at least partially, within the main memory 804, within the static memory 806, and/or within the processor unit 802 during execution thereof by the architecture 800, with the main memory 804, the static memory 806, and the processor unit 802 also constituting machine-readable media.

Executable Instructions and Machine-Storage Medium

The various memories (i.e., 804, 806, and/or memory of the processor unit(s) 802) and/or the storage device 816 may store one or more sets of instructions and data structures (e.g., the instructions 824) embodying or used by any one or more of the methodologies or functions described herein. These instructions, when executed by the processor unit(s) 802, cause various operations to implement the disclosed examples.

As used herein, the terms "machine-storage medium," "device-storage medium," and "computer-storage medium" (referred to collectively as "machine-storage medium") mean the same thing and may be used interchangeably. The terms refer to a single or multiple storage devices and/or media (e.g., a centralized or distributed database, and/or associated caches and servers) that store executable instructions and/or data, as well as cloud-based storage systems or storage networks that include multiple storage apparatus or devices. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate array (FPGA), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Signal Medium

The term "signal medium" or "transmission medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium" and "device-readable medium" mean the same thing and may be used interchangeably in this disclosure. The terms are defined to include both machine-storage media and signal media. Thus, the terms include both storage devices/media and carrier waves/modulated data signals.

The instructions 824 can further be transmitted or received over a communications network 826 using a transmission medium via the network interface device 820 using any one of a number of well-known transfer protocols (e.g., Hypertext Transfer Protocol (HTTP)). Examples of communication networks include a local area network (LAN), a wide area network (WAN), the Internet, mobile telephone networks, plain old telephone service (POTS) networks, and wireless data networks (e.g., Wi-Fi, 3G, 5G Long-Term Evolution (LTE)/LTE-A, 5G, or WiMAX networks).

Various Notes & Examples Example 1 is a circuit for biasing a power amplifier (PA), the circuit comprising: a first isolated power supply comprising a first DC output and a first common output; a second isolated power supply comprising a second DC output and a second common output, the second DC output being electrically coupled to the first common output; and a switch network, the switch network being configurable to a first state in which the first DC output is provided at a circuit output, the switch network also being configurable to a second state in which the second DC output is provided at the circuit output.

In Example 2, the subject matter of Example 1 optionally includes a switch controller circuit configured to perform operations comprising: receiving an indication of a PA input signal; and configuring the switch network to the first state based on the indication of the PA input signal.

In Example 3, the subject matter of Example 2 optionally includes the operations further comprising: determining that the PA input signal indicates a first symbol power; and determining a first PA bias level associated with the first symbol power, the first state of the switch network to provide the first PA bias level.

In Example 4, the subject matter of any one or more of Examples 1-3 optionally includes the switch network comprising: a first switch electrically coupled between the first DC output and the circuit output; and a second switch electrically coupled between the second DC output and the circuit output.

In Example 5, the subject matter of any one or more of Examples 1-4 optionally includes the first isolated power supply having a first output voltage and the second isolated power supply having a second output voltage, wherein, when the switch network is in the first state, a voltage at the circuit output is about equal to a sum of the first output voltage and the second output voltage and wherein, when the switch network is in the second state, the voltage at the circuit output is about equal to the second output voltage.

In Example 6, the subject matter of any one or more of Examples 1-5 optionally includes the first isolated power supply having a first output current and the second isolated power supply having a second output current, wherein, when the switch network is in the first state, a current at the circuit output is about equal to a sum of the first output current and the second output current and wherein, when the switch network is in the second state, the voltage as the circuit output is about equal to the second output current.

In Example 7, the subject matter of any one or more of Examples 5-6 optionally includes wherein, when the switch network is in the first state, a power available at the circuit output is about equal to a sum of a power of the first isolated power supply and a power of the second isolated power supply.

In Example 8, the subject matter of any one or more of Examples 1-7 optionally includes a third isolated power supply comprising a third DC output and a third common output, the third DC output being electrically coupled to the second common output, and the first common output being electrically coupled to the second DC output.

In Example 9, the subject matter of any one or more of Examples 1-8 optionally includes a voltage difference between the first DC output and the first common output being about equal to a voltage difference between the second DC output and the second common output.

In Example 10, the subject matter of any one or more of Examples 1-9 optionally includes an output power of the first isolated power supply being about equal to an output power of the second isolated power supply.

Example 11 is a method of operating a power amplifier (PA) circuit, the PA circuit comprising a first isolated power supply comprising a first DC output and a first common output; a second isolated power supply comprising a second DC output and a second common output, the second DC output being electrically coupled to the first common output; and a switch network, the method comprising: selecting a bias level for the PA based at least in part on a PA input signal; and configuring the switch network to a first state corresponding to the selected bias level.

In Example 12, the subject matter of Example 11 optionally includes wherein, in the first state, the first DC output is provided as a bias power to the PA.

In Example 13, the subject matter of any one or more of Examples 11-12 optionally includes the first isolated power supply having a first output voltage and the second isolated power supply having a second output voltage, wherein, when the switch network is in the first state, a voltage provided as a bias power to the PA is about equal to a sum of the first output voltage and the second output voltage.

In Example 14, the subject matter of any one or more of Examples 11-13 optionally includes the selecting of the bias level comprising determining that the PA input signal indicates a first symbol power, the first symbol power being associated with the selected bias level.

Example 15 is a circuit for biasing a power amplifier (PA), the circuit comprising: means for generating a first output voltage; means for generating a second output voltage, the means for generating the first output voltage and the means for generating the second output voltage being electrically coupled to generate a first voltage and a second voltage; and means for providing the first voltage or the second voltage as a bias power to the PA.

In Example 16, the subject matter of Example 15 optionally includes wherein the first voltage is a sum of the first output voltage and the second output voltage, and wherein the second voltage is about equal to the second output voltage.

In Example 17, the subject matter of any one or more of Examples 15-16 optionally includes wherein providing the first voltage as the bias power to the PA comprises applying a first power to the PA, the first power being based on a power associated with the means for generating the first output voltage and a power associated with the means for generating the second output voltage, and wherein providing the second voltage as the bias power to the PA comprises applying a second power to the PA, the second power being based on the power associated with the means for generating the second output voltage.

In Example 18, the subject matter of any one or more of Examples 15-17 optionally includes means for selecting a bias level for the PA based on a PA input signal.

In Example 19, the subject matter of Example 18 optionally includes the selecting the bias level for the PA further comprising determining that the PA input signal indicates a first symbol power, the first symbol power being associated with the selected bias level.

In Example 20, the subject matter of any one or more of Examples 15-19 optionally includes means for generating a third output voltage, the means for generating the third output voltage being electrically coupled with the means for generating the first output voltage and the means for generating the second output voltage to generate the first voltage, the second voltage, and a third voltage, wherein the means for providing the first voltage or the second voltage as a bias power to the PA is also for alternately providing the first voltage, the second voltage, or the third voltage as a bias power to the PA.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer-readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine-readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine-readable media.

While the machine-readable medium can include a single medium, the term "machine-readable medium" may include a single medium or multiple media (e.g., a centralized or distributed database, and/or associated caches and servers) configured to store the one or more instructions.

The term "machine-readable medium" may include any medium that is capable of storing, encoding, or carrying instructions for execution by the machine and that cause the machine to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the inventive subject matter should be determined with reference to the appended claims, along with the full scope of equivalents to which such claims are entitled.

What is claimed is:

1. A circuit for biasing a power amplifier (PA), the circuit comprising:
   a first isolated power supply comprising a first DC output and a first common output;
   a second isolated power supply comprising a second DC output and a second common output, the second DC output being electrically coupled to the first common output; and
   a switch network, the switch network being configurable to a first state in which the first DC output is provided at a circuit output, the switch network also being configurable to a second state in which the second DC output is provided at the circuit output.

2. The circuit of claim 1, further comprising:
   a switch controller circuit configured to perform operations comprising:
      receiving an indication of a PA input signal; and
      configuring the switch network to the first state based on the indication of the PA input signal.

3. The circuit of claim 2, the operations further comprising:
   determining that the PA input signal indicates a first symbol power; and
   determining a first PA bias level associated with the first symbol power, the first state of the switch network to provide the first PA bias level.

4. The circuit of claim 1, the switch network comprising:
   a first switch electrically coupled between the first DC output and the circuit output; and
   a second switch electrically coupled between the second DC output and the circuit output.

5. The circuit of claim 1, the first isolated power supply having a first output voltage and the second isolated power supply having a second output voltage, wherein, when the switch network is in the first state, a voltage at the circuit output is about equal to a sum of the first output voltage and the second output voltage and wherein, when the switch network is in the second state, the voltage at the circuit output is about equal to the second output voltage.

6. The circuit of claim 1, the first isolated power supply having a first output current and the second isolated power supply having a second output current, wherein, when the switch network is in the first state, a current at the circuit output is about equal to a sum of the first output current and the second output current and wherein, when the switch network is in the second state, the voltage as the circuit output is about equal to the second output current.

7. The circuit of claim 5, wherein, when the switch network is in the first state, a power available at the circuit output is about equal to a sum of a power of the first isolated power supply and a power of the second isolated power supply.

8. The circuit of claim 1, further comprising a third isolated power supply comprising a third DC output and a third common output, the third DC output being electrically coupled to the second common output, and the first common output being electrically coupled to the second DC output.

9. The circuit of claim 1, a voltage difference between the first DC output and the first common output being about equal to a voltage difference between the second DC output and the second common output.

10. The circuit of claim 1, an output power of the first isolated power supply being about equal to an output power of the second isolated power supply.

11. A method of operating a power amplifier (PA) circuit, the PA circuit comprising a first isolated power supply comprising a first DC output and a first common output; a second isolated power supply comprising a second DC output and a second common output, the second DC output being electrically coupled to the first common output; and a switch network, the method comprising:
   selecting a bias level for the PA based at least in part on a PA input signal; and
   configuring the switch network to a first state corresponding to the selected bias level.

12. The method of claim 11, wherein, in the first state, the first DC output is provided as a bias power to the PA.

13. The method of claim 11, the first isolated power supply having a first output voltage and the second isolated power supply having a second output voltage, wherein, when the switch network is in the first state, a voltage provided as a bias power to the PA is about equal to a sum of the first output voltage and the second output voltage.

14. The method of claim 11, the selecting of the bias level comprising determining that the PA input signal indicates a first symbol power, the first symbol power being associated with the selected bias level.

* * * * *